United States Patent
Fan et al.

(10) Patent No.: US 6,380,788 B1
(45) Date of Patent: Apr. 30, 2002

(54) PROGRAMMABLE CLOCK TRUNK ARCHITECTURE

(75) Inventors: Chen-Teng Fan; Jyh-Herng Wang, both of Hsinchu Hsien; Yu-Wen Tsai, Changhua; Peng-Chuan Huang, Tainan, all of (TW)

(73) Assignee: Faraday Technology Corp., Hsinchu (TW)

( * ) Notice: Subject to any disclaimer, the term of this patent is extended or adjusted under 35 U.S.C. 154(b) by 0 days.

(21) Appl. No.: 09/853,179

(22) Filed: May 9, 2001

(30) Foreign Application Priority Data

Dec. 22, 2000 (TW) ........................................ 89127632 A (51) Int. Cl.[7] ................................................ H03K 3/00
(52) U.S. Cl. ...................... 327/295; 327/293; 327/565; 326/93
(58) Field of Search ................................. 327/293, 297, 327/295, 403, 404, 564, 565, 566; 326/86, 93

(56) References Cited

U.S. PATENT DOCUMENTS

| | | | |
|---|---|---|---|
| 3,921,079 A | * 11/1975 | Heffner et al. ............... | 327/295 |
| 5,013,942 A | * 5/1991 | Nishimura et al. .......... | 327/297 |
| 5,122,693 A | * 6/1992 | Honda et al. ................ | 327/565 |
| 5,394,443 A | * 2/1995 | Byers et al. ................. | 327/295 |
| 5,686,845 A | * 11/1997 | Erdal et al. .................... | 326/93 |
| 6,204,713 B1 | * 3/2001 | Adams et al. ............... | 327/295 |

* cited by examiner

Primary Examiner—Terry D. Cunningham
Assistant Examiner—An T. Luu
(74) Attorney, Agent, or Firm—J.C. Patents (57) ABSTRACT

A clock architecture including a clock source, a multi-phase clock signal generator, a control bus, a number of clock signal lines, and at least one circuit block. The clock source generates a global clock signal, which is then transferred to the multi-phase clock signal generator connected to the clock source. Upon receipt of global clock signal, the multi-phase clock signal generator, which is connected to a control bus, generates clock signals of different phases according to the signals from the control bus. Each of the clock signal branches transfers one of the clock signals of different phases, wherein each of the clock signal branches is individually connected to the circuit block through an electrical switch. Only one switch is at an on state at one time, so that the clock signal of a corresponding phase is transferred to the circuit block. The driving forces applied on the clock buffer connected to the clock source and the clock buffers on the branches are adjustable for reducing clock skew. Alternately, programmable delay buffers can be used for achieving the same goal.

19 Claims, 7 Drawing Sheets

PROGRAMMABLE CLOCK TRUNK ARCHITECTURE

CROSS-REFERENCE TO RELATED APPLICATION

This application claims the priority benefit of Taiwan application serial no. 89127632, filed on Dec. 22, 2000.

BACKGROUND OF THE INVENTION

1. Field of Invention

The present invention relates to a clock trunk architecture. More particularly, the present invention relates to a programmable clock trunk architecture for adjusting clock skew.

2. Description of Related Art

The operation of integrated circuits, for example, central processing units or memories, normally requires the presence of a clock signal. Within an integrated circuit, cells such as flip-flops are either activated by a clock signal, or use a clock signal as a reference in operations. For providing a clock signal to various cells of an integrated circuit, a clock signal generator is often used within the layout of the integrated circuit. In a real world application, the actual lengths of conducting lines from cells of an integrated circuit to the clock signal generator may vary accordingly to the layout of the integrated circuit. Therefore, clock delay and clock skew usually occurs during operations when the clock signal is sent to more than one cell within an integrated circuit.

Between the time it takes for a clock signal to go from the clock signal generator to the cells such as a flip-flop, there might be a time difference, a clock delay, usually caused by the clock buffers and the conducting line between the clock signal generator and the cells. The circuit layout may also cause a clock skew, which represents a time difference between the clock signals actually received at two adjacent cells, even though the clock signals are generated by the same clock signal generator.

Several conventional architectures for transferring clock signals to cells have been used in the designs of circuit layouts, including WASP, trunk-like, divided trunk-like, sub-block, H-tree, and mesh type architectures, which are shown in FIGS. 1A to 1F respectively. For understanding the foregoing architectures, the bold lines represent the trunks of architectures, and arrowheads represent the transfer directions of clock signals in each of the clock trunk architectures.

Figure 1A:
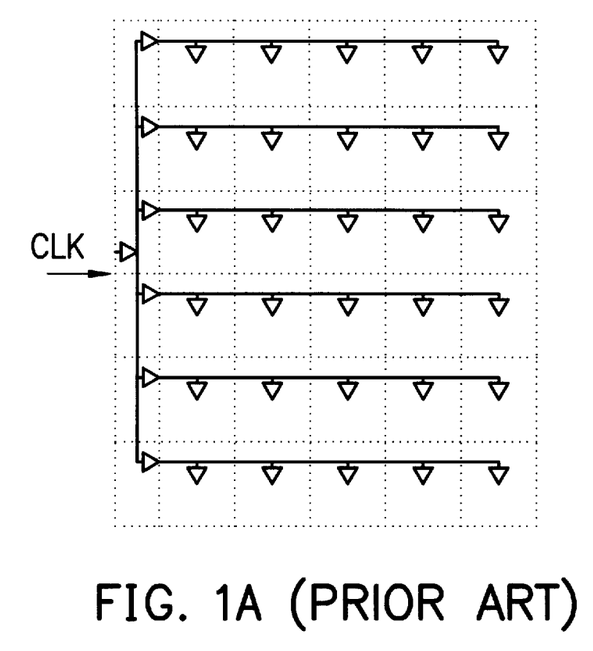
FIGS. 1A to 1F are schematic diagrams of conventional clock architectures.
Figure 1B:
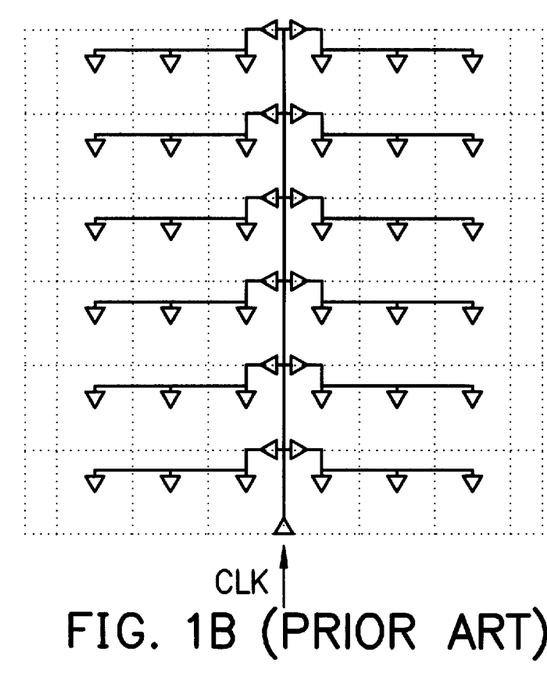
Figure 1C:
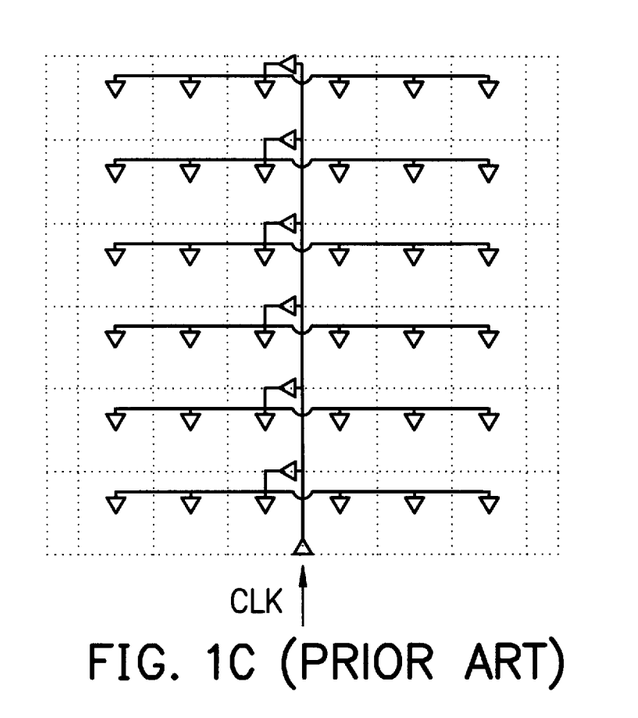
Figure 1D:
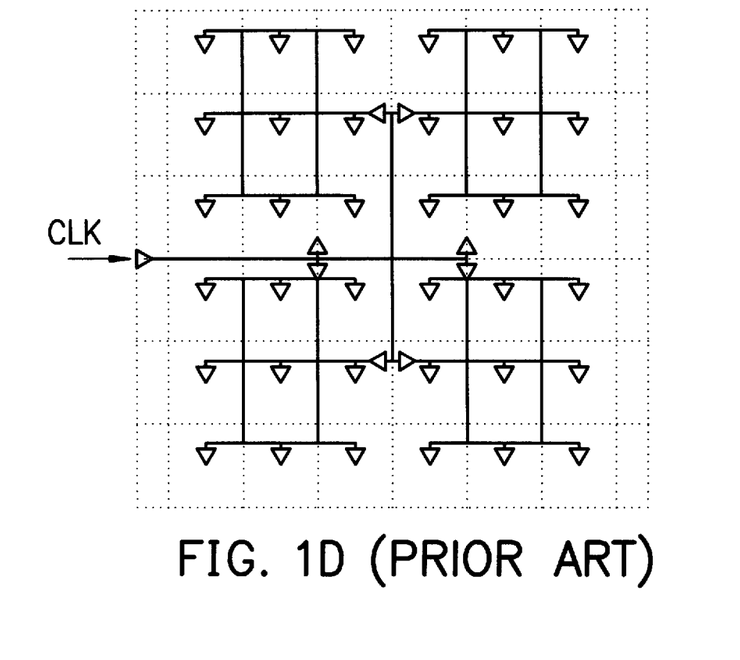
Figure 1E:
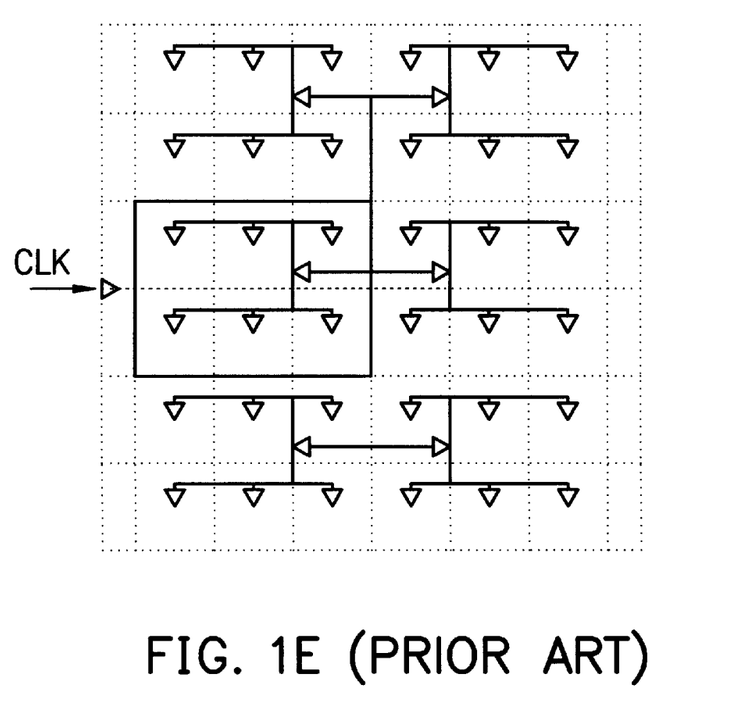
Figure 1F:
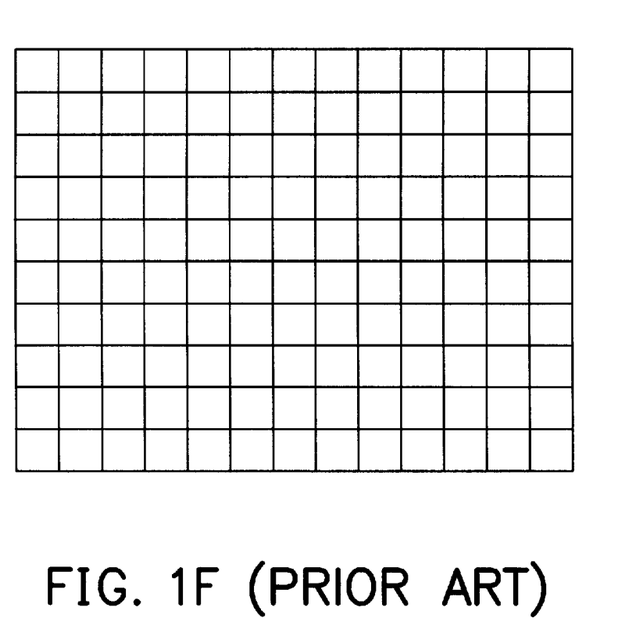
Figure 2A:
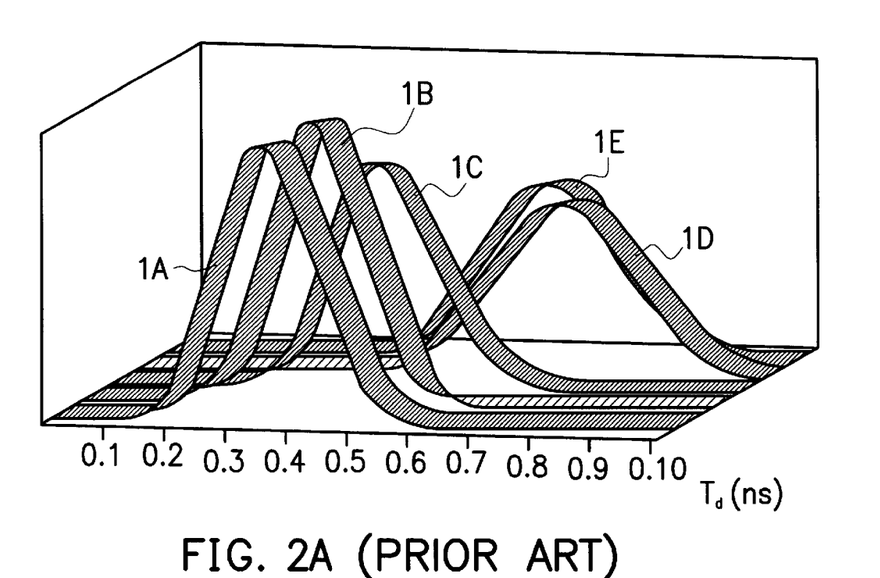
FIGS. 2A is a probability chart showing clock delays of the clock architectures shown in FIGS. 1A to 1F.
Figure 2B:
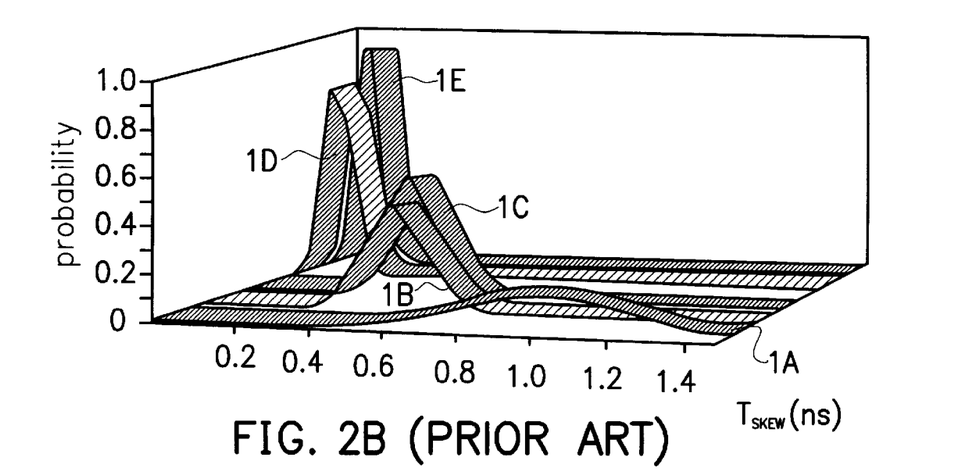
FIG. 2B is a probability chart showing clock skews of the clock architectures shown in FIGS. 1A to 1F.

FIG. 2A is a normalized chart showing the probability of the variation of the clock delay ($t_d$) of different architectures shown in FIGS. 1A to 1F. FIG. 2B is also a normalized chart but showing the probability of the variation of the clock skew ($t_{skew}$) of different architectures shown in FIGS. 1A to 1F. As shown in FIG. 2A, the clock delay of a H-tree type architecture is relatively large and widely spread. According to FIG. 2B, it can be seen that the clock skew of trunk-like architectures is relatively large, and widely spread. The mesh type architecture does not have the problems of the H-tree type and trunk-like architectures, however, its overhead area is large. In the flatten-mode circuit layout, the foregoing architectures are still applicable. In the hierarchy-mode circuit layout, however, neither of the foregoing architectures is able to provide a flexible range for adjusting clock skew, especially on the upper level.

Figure 3A:
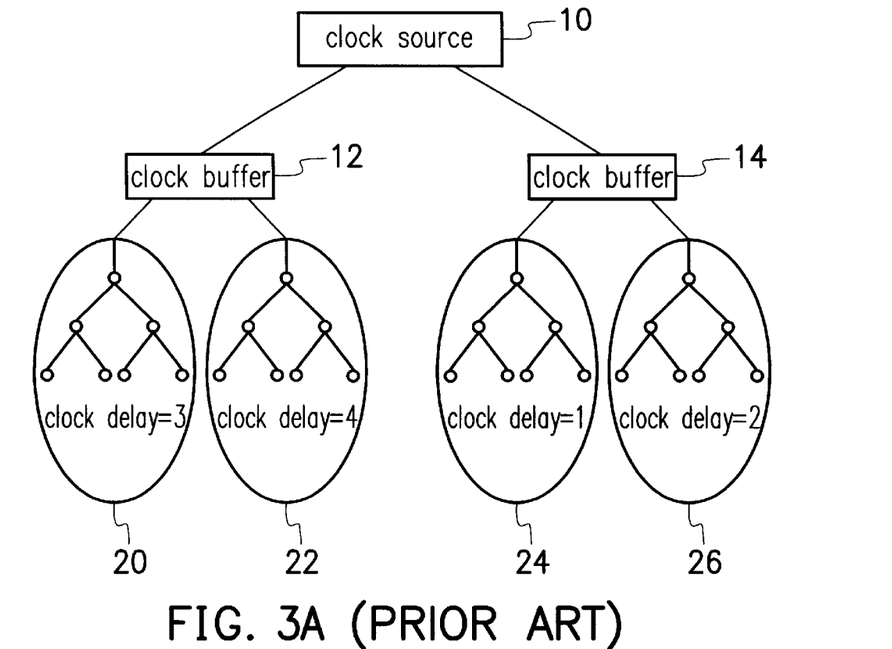
FIGS. 3A and 3B are schematic diagrams of another conventional clock architecture for resolving clock delay and clock skew.

In order to resolve the problems of clock delay, and clock skew, another clock architecture was developed. As shown in FIG. 3A, a clock signal from the clock source 10 is transferred to sub-circuits 20, 22, 24, and 26 through clock buffers 12 and 14, wherein sub-circuits 20 and 22 are connected to clock buffer 12, and sub-circuits 24 and 26 are connected to clock buffer 14. The idea of this clock architecture is to connect sub-circuits having close clock delays to the same clock buffer, so that the clock skew can be reduced by adjusting the driving force on the clock buffer. If the clock delays on sub-circuits 20, 22, 24, and 26 are 3, 4, 1, and 2 respectively, the clock delays and clock skew on all sub-circuits can be effectively reduced by adjusting the driving forces applied on clock buffers 12 and 14 respectively.

Figure 3B:
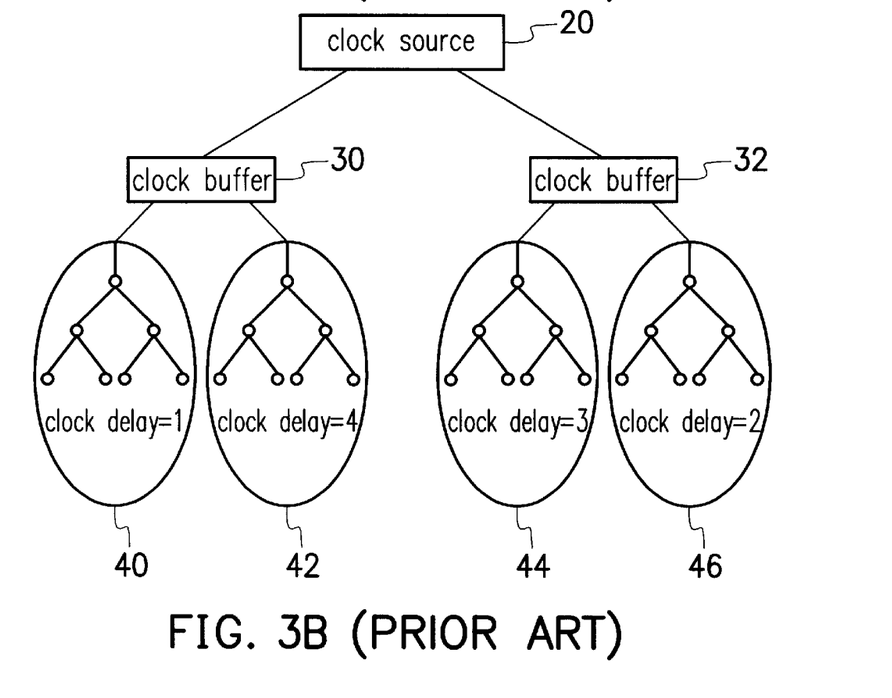

However, in such a clock architecture, the flexibility of adjusting clock skew is still limited. As shown in FIG. 3B, it is difficult to reduce the clock skew occurring between sub-circuits 40 and 42 since the difference between the clock delays on sub-circuits 40 and 42 is too large. It is also difficult to reduce the clock skew between cells or sub-circuits that are connected to a clock source across long conducting lines, since the clock delays on those cells or sub-circuits is essentially larger.

In addition, clock skews between cells, especially for those on a circuit of hierarchy mode, cannot be effectively reduced by conventional clock architectures.

SUMMARY OF THE INVENTION

Accordingly, one object of the present invention is to provide a programmable clock architecture for reducing the clock delays on cells, as well as the clock skews between cells.

A second object of this invention is to provide a clock architecture capable of efficiently distributing clock signals over cells of circuits in a hierarchy mode, and silicon-on-chip (SOC) circuits.

A third object of this invention is to provide a clock architecture having a greater flexibility for adjusting clock skew.

To achieve these and other advantages, and in accordance with the purpose of the invention, as embodied and broadly described herein, the invention provides a clock architecture including a clock source, a trunk, a number of branches, and at least one circuit block. The clock source provides a clock signal. The trunk is connected to the clock source for transferring the clock signal to branches, wherein each branch is connected to the trunk at one end. Each branch transfers a clock signal through at least one clock buffer, wherein each clock buffer is capable of shifting the phase of the clock signal that passes through it. The number of clock buffers located along a branch depends on the required phase shift, therefore, it may vary from branch to branch. The circuit block is connected to all branches through switches, wherein each switch controls the connection between the circuit block and one of branches, and only one switch is on at any one time. The circuit block then receives the clock signal from the branch with an on-state switch.

The switches of the invention can be controlled by programmable switch devices, such as a metal oxide semiconductor transistor switch, I/O pins, ROM code or metal options, so that the on/off state thereof can be controlled in a flexible manner.

In the preferred embodiment of this invention, the clock architecture of the invention includes a clock source, a multi-phase clock signal generator, a control bus, a number of clock signal lines, and at least one circuit block. The clock source generates a global clock signal, which is then transferred to the multi-phase clock signal generator connected to the clock source. Upon receipt of a global clock signal, the multi-phase clock signal generator, which is connected to a control bus, generates clock signals of different phases according to the signals from the control bus. Each of the clock signal branches transfers one of the clock signals of different phases, wherein each of the clock signal branches is individually connected to the circuit block through an electrical switch. Only one switch is at an on state at any one time, so that the clock signal of a corresponding phase is transferred to the circuit block.

The switches and control bus of the invention can be controlled by programmable switch devices, such as a metal oxide semiconductor transistor switch, I/O pins, ROM code or metal options, so that the on/off state thereof can be controlled in a flexible manner.

In this invention, the driving forces of the clock buffer connected to the clock source and the clock buffers on the branches are adjustable for reducing clock skew. Alternately, programmable delay buffers can be used for achieving the same goal. Each of the circuit blocks, modules, or IPs can selectively receive a proper clock signal from the selected branch or clock signal line.

It is to be understood that both the foregoing general description and the following detailed description are exemplary, and are intended to provide further explanation of the invention as claimed.

BRIEF DESCRIPTION OF THE DRAWINGS

The accompanying drawings are included to provide further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 4:
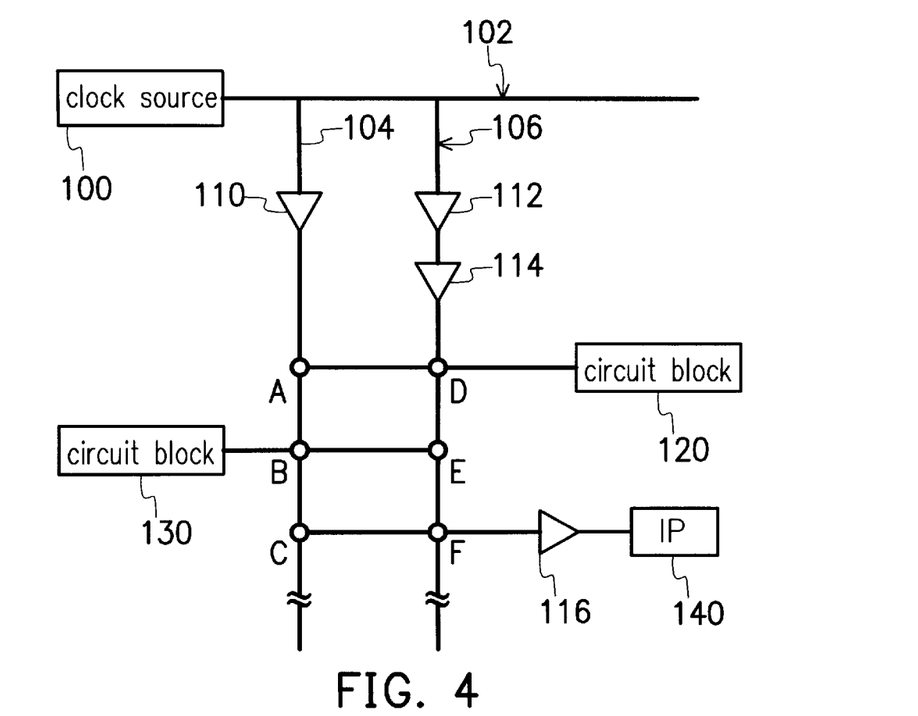
FIG. 4 is a schematic diagram of a clock architecture according to one embodiment of this invention.

The clock architecture according to the preferred embodiment of the invention is shown in FIG. 4. As referring to FIG. 4, the clock architecture of the invention includes a clock source 100, a trunk 102, and a number of branches, 104 and 106. Clock buffers 110, 112 and 114, are used to add more delays on the clock signals transferred along the branches 104 and 106. By changing the number of clock buffers along each of branches or adjusting the sizes of clock buffers individually, the desired clock signals can be obtained.

Circuit blocks 120, 130 and 140 are connected to branches 104 and 106 through electrical switches A, B, C and D, E, F respectively, wherein the circuit blocks can be hard block, soft block or IP module. For each of the circuit blocks 120, 130 or 140, only one electrical switches is on, that is, either A or D, B or E, and C or F are on, so that each circuit block can only receive a clock signal from either branch 104 or branch 106. By properly controlling the states of electrical switches A to F, only clock signals with desired phase shifts can be transferred to the circuit blocks 120, 130 and 140. As referring to FIG. 4, the clock signal transferred along branch 104 passes through one clock buffer 110 before it reaches electrical switch A. On the other hand, the clock signal transferred along branch 106 passes through two clock buffers 112 and 114 before it reaches the electrical switch D. Hence, by properly selecting the sizes of clock buffers 110, 112 and 114, or changing the number of clock buffers placed along each branch, properly shifted clock signals can be obtained. Alternately, programmable delay buffers can also be used for the same purpose.

Circuit blocks 120, 130 and 140 are individually connected to each of the branches 104 and 106 through electrical switches A–F, so they can receive the most suitable clock signals by properly setting the states of electrical switches A–F.

In addition, if required, additional clock buffers can be added between the circuit blocks, and the corresponding electrical switches. For example, the circuit block 140, IP module, is first connected to a clock buffer 116, then to the electrical switches C and F for electrically coupling with branches 104 and 106.

The on/off states of all electrical switches A–F can be controlled by programmable switch device, such as a regular metal-oxide-semiconductor transistor switches, I/O pins, ROM codes or metal options.

Figure 5:
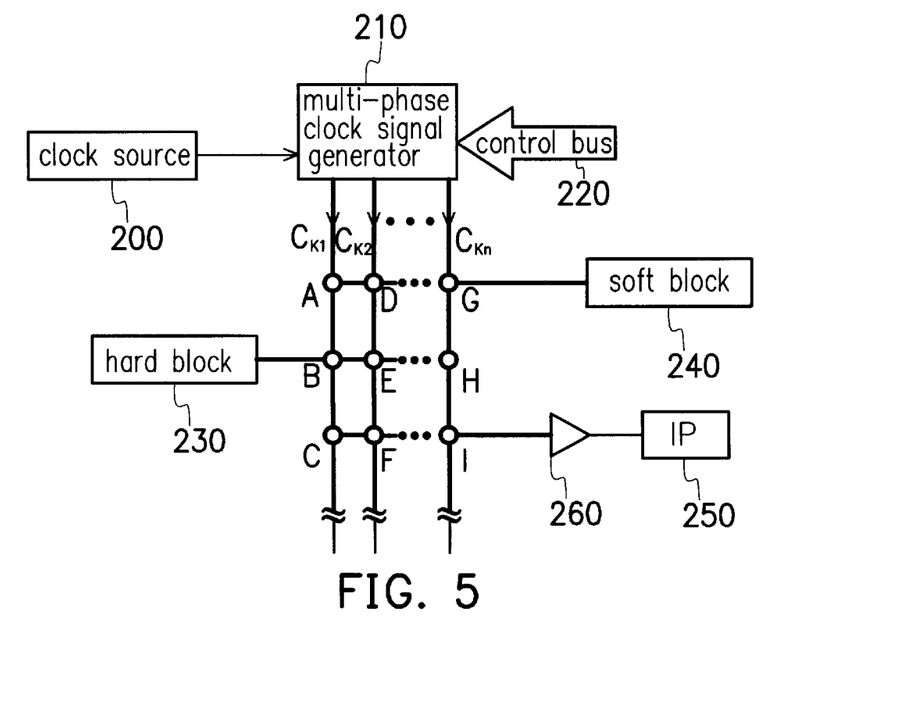
FIG. 5 is a schematic diagram of a clock architecture according to another embodiment of this invention.

As referred to FIG. 5, the clock architecture according to another embodiment of the invention includes a clock source 200, a multi-phase clock signal generator 210, control bus 220, a number of clock signal branches CK1–CKn and at least one circuit block. The circuit block can be a hard block 230, a soft block 240 or an IP module 250.

The clock source 200 provides an original clock signal. The multi-phase clock signal generator 210 is connected to the clock source 200 for receiving the original clock signal, and generates clock signals of a number of different phases upon receipt of the original clock signal. The control bus 220 is in connection with the multi-phase clock signal generator 210 for controlling the phases of clock signals from the multi-phase clock signal generator 210. Each of the clock signal branches CK1–CKn transfers one of the clock signals from the multi-phase clock signal generator 210. Circuit blocks 230, 240 and 250 are individually connected to all clock signal lines CK1–CKn through electrical switches A–I. For each circuit block, only one of its corresponding switches is at an on state so that the circuit block can only receive one clock signal from one of the clock signal lines CK1–CKn.

Figure 6:
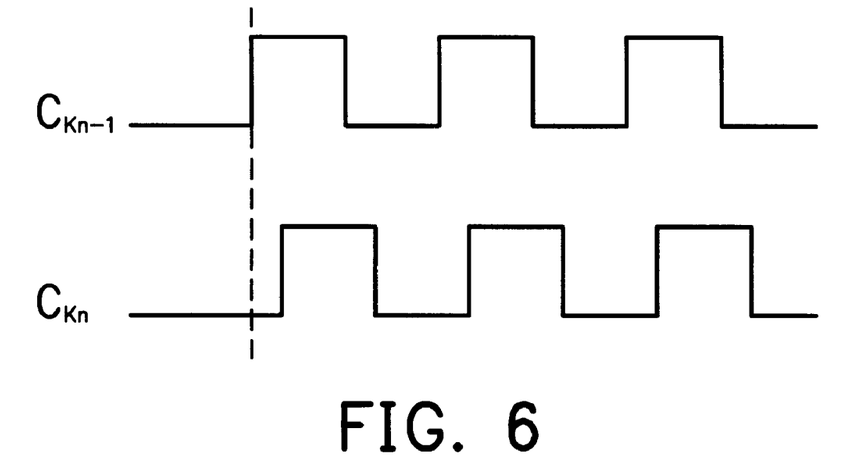
FIG. 6 is a signal chart showing the clock signals generated by the multi-phase clock signal generator of the invention.

The control bus 220 determines the value of phase shift of each clock signal from the multi-phase clock signal generator 210. Basically, each clock signal from the multi-phase clock signal generator 210 can have a different phase shift compared with the original clock signal from the clock source 200. Of course, some of the clock signals from the multi-phase clock signal generator 210 can have the same phase shift according to actual circuit design as well. An example is shown in FIG. 6, which shows the waveforms of two clock signals from the multi-phase clock signal generator 220. The values of phase shift on each clock signal can be either preset or changed by programs through the control bus 220.

Circuit blocks 230, 240 and 250 are connected to clock signal branches CK1–CKn through electrical switches (A, D, G), (B, E, H) and (C, F, I) respectively, wherein the circuit blocks can be hard block, soft block or IP module. For each of the circuit block 230, 240 or 250, only one electrical switche is on, that is, either A, D or G, B, E or H, and C, F or I are on, so that each circuit block only receives clock signals from one of the clock signal branches CK1–CKn. By properly controlling the states of electrical switches A to I, only clock signals with desired phase shifts can be transferred to the circuit blocks 230, 240, and 250.

Circuit block 240 of FIG. 5 is connected to clock signal lines CK1, CK2, . . . , CKn with electrical switches A, D and G. By setting the on/off states of electrical switches A, D and G, a desired clock signal is then transferred to the circuit block 240. For example, if switch A is turned on, and switches D and G are turned off, circuit block 240 is only electrically coupled with clock signal line CK1, and receives only the clock signal transferred along clock signal line CK1. Similarly, circuit blocks 230 or 250 can receive clock signals with proper phase shifts by correctly setting the electrical switches.

In addition, if required, additional clock buffers can be added between the circuit blocks, and the corresponding electrical switches. For example, the circuit block 250, IP module, is first connected to a clock buffer 260, then to the electrical switches C, F and I for electrically coupling with clock signal lines CK1–CKn.

The on/off states of all electrical switches A–I can be controlled by programmable switch device, such as ordinary metal-oxide-semiconductor transistor switches, I/O pins, ROM codes or metal options.

According to the foregoing, the clock architectures of the invention contains adjustable clock buffers or delay buffers connected to the clock source for tuning clock delays. In the meantime, the width of each branch is also adjustable. Therefore, by setting the corresponding switches, each circuit block can have a properly adjusted clock signal according to actual needs to resolve the problems of clock skew. A program may also be used to adjust clock signals and define the states of switches for achieving the same goal.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A clock architecture comprising:

a clock source, for generating a clock signal;

a trunk, electrically coupling to the clock source for transferring the clock signal;

a plurality of branches, individually coupling with the trunk for receiving the clock signal, wherein each of the branches has at least a clock buffer for causing a phase shift on the clock signal, and wherein each of the branches has a different number of the clock buffers for causing different phase shifts; and at least a circuit block, connected to the branches through a plurality of electrical switches, wherein only one of the electrical switches is turned on at any one time.

2. The clock architecture of claim 1, wherein the electrical switches are controlled by a programmable switch device.

3. The clock architecture of claim 2, wherein the programmable switch device includes a metal-oxide-semiconductor transistor.

4. The clock architecture of claim 2, wherein the programmable switch device includes a I/O pin.

5. The clock architecture of claim 2, wherein the programmable switch device includes a ROM code.

6. The clock architecture of claim 2, wherein the programmable switch device includes a metal option.

7. The clock architecture of claim 1, further comprises at least an additional clock buffer placed between the circuit block and the electrical switches.

8. A clock architecture comprising:

a clock source, generating a clock signal;

a multi-phase clock signal generator, connected to the clock source for receiving the clock signal and generating a plurality of phase-shifted clock signals, wherein each of the phase-shifted clock signals has a phase shift;

a control bus, connected to the multi-phase clock signal generator for controlling the multi-phase clock signal generator and determining the phase shift;

a plurality of clock signal branches, each receives and transfers one of the phase-shifted clock signals; and at least one circuit block, connected to each of the clock signal lines through a plurality of electrical switches, wherein only one of the electrical switches is turned on at one time.

9. The clock architecture of claim 8, wherein the electrical switches are controlled by a programmable switch device.

10. The clock architecture of claim 9, wherein the programmable switch device includes a metal-oxide-semiconductor transistor.

11. The clock architecture of claim 9, wherein the programmable switch device includes a I/O pin.

12. The clock architecture of claim 9, wherein the programmable switch device includes a ROM code.

13. The clock architecture of claim 9, wherein the programmable switch device includes a metal option.

14. The clock architecture of claim 8, wherein the control bus is controlled by a programmable switch device.

15. The clock architecture of claim 14, wherein the programmable switch device includes a metal-oxide-semiconductor transistor.

16. The clock architecture of claim 14, wherein the programmable switch device includes a I/O pin.

17. The clock architecture of claim 14, wherein the programmable switch device includes a ROM code.

18. The clock architecture of claim 14, wherein the programmable switch device includes a metal option.

19. The clock architecture of claim 8, further comprises at least an additional clock buffer placed between the circuit block and the electrical switches.

* * * * *